United States Patent
Lai et al.

(10) Patent No.: US 7,087,968 B1
(45) Date of Patent: Aug. 8, 2006

(54) ELECTROSTATIC DISCHARGE PROTECTION CIRCUIT AND SEMICONDUCTOR CIRCUIT THEREWITH

(75) Inventors: Chun-Hsiang Lai, Hsinchu (TW); Yen-Hung Yeh, Hsinchu (TW); Chia-Ling Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/141,284

(22) Filed: May 31, 2005

(51) Int. Cl.
*H01L 23/62* (2006.01)

(52) U.S. Cl. ................ 257/355; 257/360; 257/E29.169

(58) Field of Classification Search ................ 257/355, 257/356, 360, 365, 368
See application file for complete search history.

(56) References Cited

U.S. PATENT DOCUMENTS

| | | | |
|---|---|---|---|
| 6,002,568 A | 12/1999 | Ker et al. | 361/111 |
| 6,011,681 A | 1/2000 | Ker et al. | 361/111 |
| 6,720,623 B1 | 4/2004 | Chen | 257/355 |
| 6,762,439 B1* | 7/2004 | Chen et al. | 257/173 |
| 6,949,802 B1* | 9/2005 | Shih et al. | 257/401 |
| 2005/0145947 A1* | 7/2005 | Russ et al. | 257/356 |

\* cited by examiner

*Primary Examiner*—T. N. Quach
(74) *Attorney, Agent, or Firm*—J. C. Patents (57) ABSTRACT

An ESD protection circuit is adapted for an integrated circuit with a first power source and a second power source. The ESD protection circuit comprises a first silicon controlled rectifier (SCR), a second silicon controlled rectifier, and a parasitic diode. The gate of the first silicon controlled rectifier is coupled to a first power source, and the gate of the second silicon controlled rectifier is also coupled to the first power source line.

42 Claims, 6 Drawing Sheets

ELECTROSTATIC DISCHARGE PROTECTION CIRCUIT AND SEMICONDUCTOR CIRCUIT THEREWITH

BACKGROUND OF THE INVENTION

1. Field of the Invention

The present invention relates to a protection circuit, and more particularly, to an electrostatic discharge (ESD) protection circuit.

2. Description of the Related Art

Due to the innovation of manufacturing technology, semiconductor circuits require lower and lower operating voltage, thus saving power. Since voltages provided to semiconductor circuits are not an ideally standard value, abnormal high-voltage electrostatic voltage noises occur from time to time. If not curbed, these high-voltage electrostatic voltage noises may easily damage semiconductor circuits during operation. Accordingly, the prevention of integrated circuits from the damage of electrostatic voltage noises is the duty of protection circuits.

Figure 1:
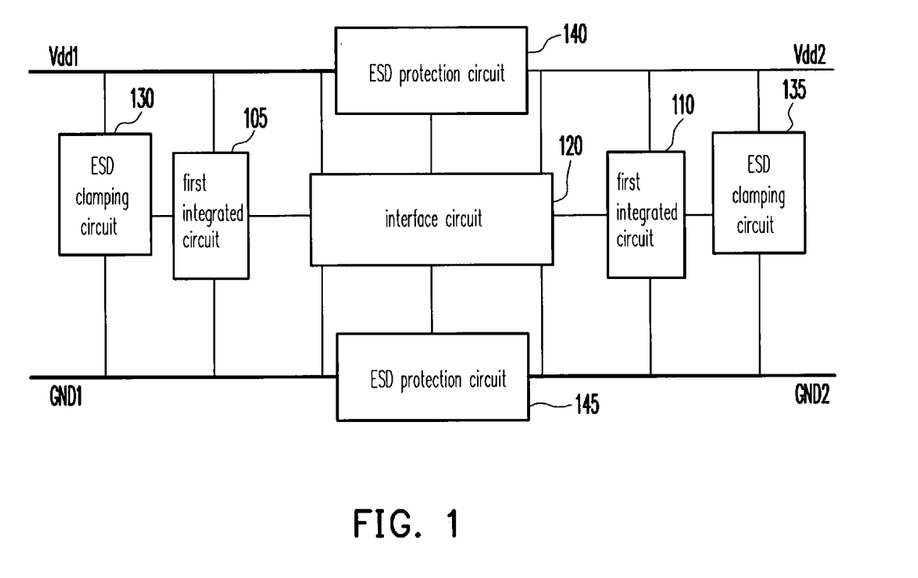
FIG. 1 is a schematic block circuit diagram showing an ESD protection circuit structure.

FIG. 1 is a schematic block circuit diagram showing an ESD protection circuit structure. Referring to FIG. 1, the ESD protection circuit structure comprises two ESD protection clamping circuits 130 and 135, and two ESD protection circuits 140 and 145. Wherein, the circuit to be protected includes the integrated circuits 105 and 110, and the interface circuit 130 between the integrated circuits 105 and 110. These ESD protection circuits 140 and 145 are circuits having the same function.

The integrated circuit 105 is coupled to the first power source Vdd1 and the first ground terminal GND1. The integrated circuit 110 is coupled to the second power source Vdd2 and the second ground terminal GND2. The interface circuit 120 is electrically coupled to the first power source Vdd1, the first ground terminal GND1, the second power source Vdd2, and the second ground terminal GND2.

If the first power source Vdd1 has an electrostatic voltage noise, theoretically, the ESD clamping circuit 130 and the ESD protection circuit 140 are immediately turned on. The current generated from the electrostatic voltage noise then flows to the first ground terminal GND1 and the second power source Vdd2 through the ESD clamping circuit 130 and the ESD protection circuit 140 such that the noise current would not flow through and damage the integrated circuit 105 and the interface circuit 120. In contrary, if the second power source Vdd2 has an electrostatic voltage noise, the ESD clamping circuit 135 and the ESD protection circuit 145 are immediately turned on. The current generated from the electrostatic voltage noise flows to the second ground terminal GND2 and the first power source Vdd1 through the ESD clamping circuit 135 and the ESD protection circuit 145 such that the noise current would not flow through and damage the integrated circuit 110 and the interface circuit 120.

In the prior art, these ESD protection circuits 140 and 145 are usually made of diodes or silicon controlled rectifiers (SCRs), characterized by the low operating voltage and low generating power. The SCRs include lateral SCRs (LSCRs), and low-voltage trigger SCRs (LVTSCRs).

Figure 2:
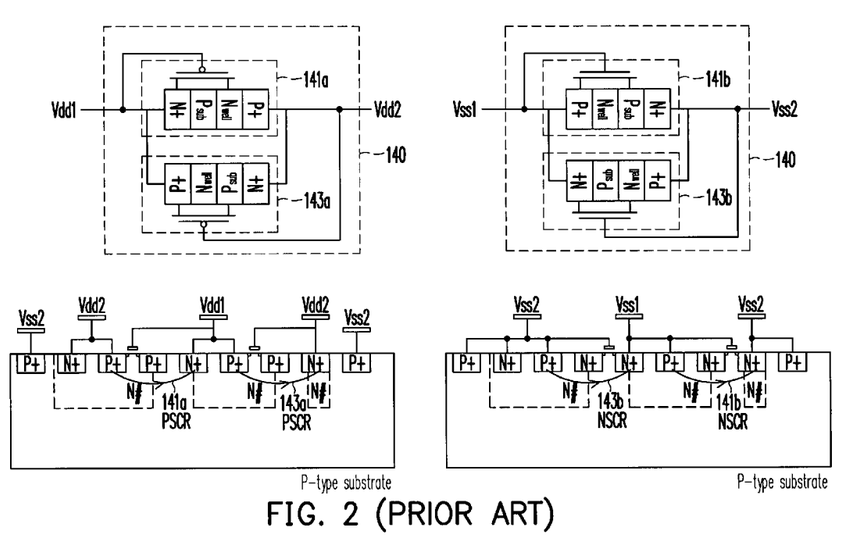
FIG. 2 is schematic block circuit and cross-sectional configurations—showing a conventional ESD protection circuit of FIG. 1.

FIG. 2 is schematic block circuit and cross sectional configurations showing a conventional ESD protection circuit in FIG. 1. The conventional SCR is a LSCR. The LSCR comprises a positive-channel metal-oxide-semiconductor (PMSO) transistor and an N$^+$-well region, which is named a P-type SCR (PSCR). In another example, the LSCR may comprise a negative-channel metal-oxide-semiconductor (NMSO) transistor and a P$^+$-well region, which is named an N-type SCR (NSCR). In order to illustrate the operating theory, an equivalent PMOS transistor diagram is added in the left configuration of FIG. 2, and an equivalent NMOS transistor diagram is added in the right configuration of FIG. 2. These two circuits in FIG. 2 have the same function.

The circuit in the left configuration of FIG. 2 comprises two PSCRs 141a and 143a, wherein the control gate of the PMOS transistor of the PSCR 141a is coupled to the first power source Vdd1, and the control gate of the PMOS transistor of the PSCR 143a is coupled to the second power source Vdd2. Other connection specifics are shown in FIG. 2. While the first power source Vdd1 generates a higher positive electrostatic voltage noise, at this moment the voltage difference between the control gate of the PMOS transistor and the anode (the source of the PMOS transistor) of the PSCR 143a is higher than the threshold voltage of the PMOS transistor. Accordingly, a current path is generated and the first and the second power sources Vdd1 and Vdd2 are connected through the PSCR 143a. Usually, the threshold voltage is 0.4~2V. For simple descriptions, all threshold voltages described below are 1V.

Accordingly, while the second power source Vdd2 generates a higher-voltage electrostatic voltage noise, at this moment, the voltage difference between the control gate of the PMOS transistor and the anode (the source of the PMOS transistor) of the PSCR 141a, is higher than the threshold voltage, about 1V, of the PMOS transistor. Accordingly, a current path is generated and the first and the second power sources Vdd1 and Vdd2 are connected through the PSCR 141a such that the current generated from the electrostatic voltage noise will not damage internal circuits.

The circuit in the right configuration of FIG. 2 comprises two NSCRs 141b and 143b, wherein the control gate of the NMOS transistor of the NSCR 141b is coupled to the power source Vss2, and the control gate of the NMOS transistor of the NSCR 143b is coupled to the power source Vss1. Other connection specifics in the circuit are shown in FIG. 2. The source voltages Vss1 and Vss2 are similar to the first and the second power sources Vdd1 and Vdd2. When the power source Vss1 generates a higher positive electrostatic voltage noise, at this moment, the voltage difference between the control gate of the NMOS transistor and the cathode (the source of the NMOS transistor) of the NSCR 141b is higher than the threshold voltage, about 1V, of the NMOS transistor. Accordingly, a current path is generated and the power sources Vss1 and Vss2 are connected through the NSCR 143b such that the current generated from the electrostatic voltage noise will not damage internal circuits. The operating theory of the NSCR 141b is similar to that of the NSCR 143b. Detailed descriptions are not repeated.

In the conventional ESD protection circuit of the ESD protection circuit structure, when the voltage difference between the first power source Vdd1 and the second power source Vdd2 is larger than 1V, the ESD protection circuit is tuned on so these integrated circuits 105 and 110 cannot receive correct data from external circuits. Therefore, only when the voltage difference between the first and the second power sources is lower than 1V may the conventional ESD protection circuit be used, or only when multiple ESD protection circuits are connected in series so that the voltage difference between the first and the second power sources is higher than 1V may the conventional ESD protection circuit be used. This limit complicates the design of the circuit. In addition, the series connection of ESD protection circuits will increase costs.

Referring to the structure configuration of FIG. 2, the control gate of the PSCR 141a is coupled to the first power source Vdd1, and the control gate of the PSCR 143a is coupled to the second power source Vdd2. As a result, N-well regions of these PSCRs 141a and 143a must be separated, and cannot be a same N-well. The structure of NSCRs 141b and 143b has the same issue. This would increase the layout area of the circuit and increase costs.

SUMMARY OF THE INVENTION

Accordingly, the present invention is directed to an electrostatic discharge (ESD) protection circuit, wherein the circuits can be designed regardless of the voltage difference between the first power source and the second power source, and the present invention can be used.

The present invention is also directed to an ESD protection circuit capable of reducing the layout area of the circuit and the manufacturing costs.

The present invention is also directed to an ESD protection circuit structure, wherein the circuits can be designed regardless of the voltage difference between the first power source and the second power source, and the present invention can be used. Moreover, the structure is capable of reducing the layout area of the circuit and the manufacturing costs.

The present invention provides an ESD protection circuit adapted for an integrated circuit with a first power source and a second power source, the protection circuit comprising a first silicon controlled rectifier, a second silicon controlled rectifier, and a parasitic diode. The first silicon controlled rectifier comprises a first metal-oxide-semiconductor transistor. Wherein, a cathode of the first silicon controlled rectifier is coupled to the first power source, and an anode of the first silicon controlled rectifier is coupled to the second power source. The second silicon controlled rectifier comprises a second metal-oxide-semiconductor transistor. Wherein, an anode of the second silicon controlled rectifier is coupled to the first power source, a cathode of the second silicon controlled rectifier is coupled to the second power source, and gates of the first and the second metal-oxide-semiconductor transistors are coupled to the first power source or the second power source. A cathode of the parasitic diode is coupled to the first power source, and an anode of the parasitic diode is coupled to the second power source.

According to an embodiment of the present invention, the first and the second power sources are high power sources (Vdd) in the system, and the first and the second metal-oxide-semiconductor transistors are P-type transistors and the gates thereof are coupled to the first power source. The ESD protection circuit then further comprises a signal delay unit electrically coupled between the first power source and the gate of the P-typed second metal-oxide-semiconductor transistor.

According to an embodiment of the present invention, the first and the second power sources are low power sources (Vss) in the system, and the first and the second metal-oxide-semiconductor transistors are N-type transistors and the gates thereof are coupled to the second power source. Then, the ESD protection circuit further comprises a signal delay unit electrically coupled between the second power source and the gate of the N-type first metal-oxide-semiconductor transistor.

The signal delay unit described above is a circuit composed of a resistor, or a circuit or a transmission gate composed of a resistor and a capacitor.

Additionally, the present invention also provides an ESD protection circuit adapted for an integrated circuit with a first power source and a second power source, the protection circuit comprising a first silicon controlled rectifier, a second silicon controlled rectifier, and a parasitic diode. The first silicon controlled rectifier comprises a first metal-oxide-semiconductor transistor. Wherein a cathode of the first silicon controlled rectifier is coupled to the first power source, and an anode of the first silicon controlled rectifier is coupled to the second power source. The second silicon controlled rectifier comprises a second metal-oxide-semiconductor transistor. Wherein an anode of the second silicon controlled rectifier is coupled to the first power source, a cathode of the second silicon controlled rectifier is coupled to the second power source, and gates of the first and the second metal-oxide-semiconductor transistors are coupled to the first power source or the second power source through a signal delay unit. A cathode of the parasitic diode is coupled to the first power source, and an anode of the parasitic diode is coupled to the second power source.

According to an embodiment of the present invention, the first and the second power sources are high power sources in the system, and the first and the second metal-oxide-semiconductor transistors are P-type transistors and the gates thereof are coupled to the first power source through the signal delay unit. According to an embodiment of the present invention, the first and the second power sources are low power sources in the system, and the first and the second metal-oxide-semiconductor transistors are N-type transistors and the gates thereof are coupled to the second power source through the signal delay unit.

The signal delay unit described above is a circuit composed of a resistor, or a circuit or a transmission gate composed of a resistor and a capacitor.

In the present invention, the control gates of the metal-oxide-semiconductor transistors of these two silicon controlled rectifiers are coupled to the same power source. As a result, turn-on or turn-off states of these two silicon controlled rectifiers are controlled by the same power source. Accordingly, without connecting multiple silicon controlled rectifiers in series, the voltage difference between the first power source and the second power source can be increased. Moreover, since coupled to the same power source, the control gates of the metal-oxide-semiconductor transistors can be formed in the same N-well region. Thus, the layout area of the circuit can be decreased and the manufacturing costs reduced.

According to an embodiment of the present invention, a semiconductor circuit for electrostatic discharge protection is provided, which is adapted for an integrated circuit with a first power source and a second power source. The protection circuit comprises a substrate; a well located within the substrate; a first and a second first-type doped regions, located within the substrate and outside the well, wherein the second first-type doped region is couple to the second power source; a first and a second second-type doped regions, respectively close to the first and the second first-type doped regions, and located within the substrate and the well; a third and a fourth second-type doped regions, respectively close to the first and the second second-type doped regions and located within the well, wherein the third second-type doped region is coupled to the second power source; a first gate structure, located above the substrate and between the first and the third second-type doped regions, wherein the first first-type doped region and the first gate structure are coupled to the first power source; a third first-type doped region, located within the well and between the third and the fourth second-type doped regions; and a second gate structure, located above the substrate and between the second and the fourth second-type doped regions, wherein the third first-typed doped region, the fourth second-type doped region and the second gate structure are coupled to the first power source. In the above structure, the third second-type doped region and the third first-type doped region form a parasitic diode. The first first-type doped region, the substrate, the well and the third second-type doped region form a first semiconductor silicon controlled rectifier. The fourth second-type doped region, the well, the substrate and the second first-type doped region form a second semiconductor silicon controlled rectifier.

According to an embodiment of the present invention, a semiconductor circuit for electrostatic discharge protection is provided, which is adapted for an integrated circuit with a first power source and a second power source. The semiconductor circuit comprises a substrate; a well located within the substrate; a first and a second first-type doped regions, located within the substrate and outside the well, wherein the first first-type doped region is couple to the first power source, and the second first-type doped region is couple to the second power source; a third and a fourth first-type doped regions, respectively close to the first and the second first-type doped regions, and located within the substrate and the well; a first gate structure, located above the substrate and between the first and the third first-type doped regions, wherein the first gate structure are coupled to the second power source; a second gate structure, located above the substrate and between the second and the fourth first-type doped regions, wherein the second gate structure are coupled to the second power source; a first and a second second-type doped regions, respectively close to the third and the fourth first-type doped regions and located within the well, wherein the first second-type doped region is coupled to the second power source and wherein the second second-type doped region is coupled to the first power source; a fifth first-type doped region, located within the well and between the first and the second second-type doped regions, wherein the said fifth first-type doped region is coupled to the first power source. In the above structure, the first second-type doped region and the fifth first-type doped region form a parasitic diode. The first first-type doped region, the substrate, the well and the first second-type doped region form a first semiconductor silicon controlled rectifier. The second second-type doped region, the well, the substrate and the second first-type doped region form a second semiconductor silicon controlled rectifier.

The above and other features of the present invention will be better understood from the following detailed description of the embodiments of the invention that is provided in conjunction with the accompanying drawings.

DESCRIPTION OF SOME EMBODIMENTS

In the present invention, control gates of two silicon controlled rectifiers (SCRs) of the prior art are coupled to the same power source. Accordingly, turn-on or turn-off states of these two SCRs is only dependent on the coupled power source. The voltage difference between the first power source and the second power source can be increased. Additionally, since coupled to the same power source, the control gates of the metal-oxide-semiconductor (MOS) transistors can be formed in the same N-well region. Thus, the layout area of the circuit can be decreased and the manufacturing costs reduced.

Figure 3:
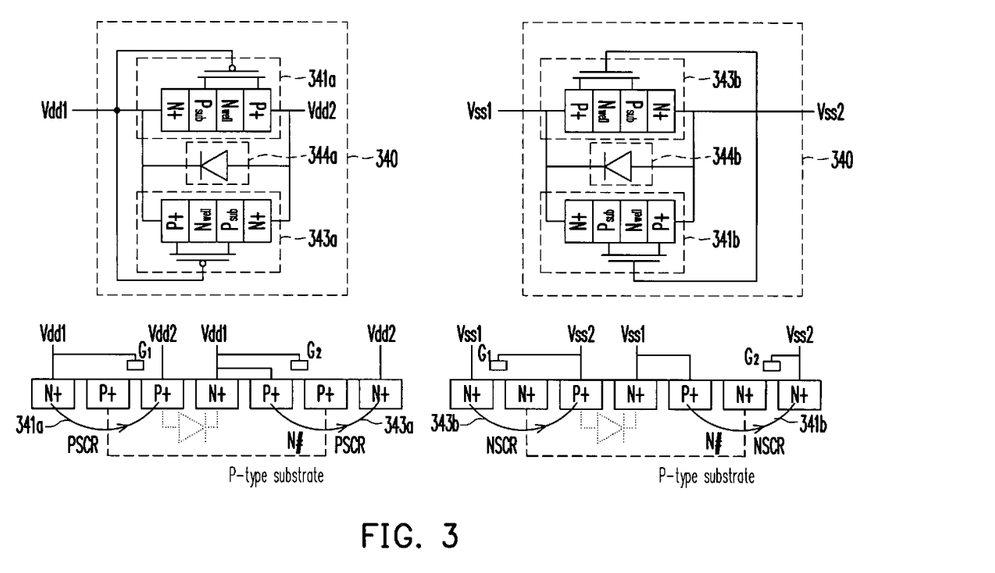
FIG. 3. is schematic configurations showing circuit block diagrams and cross sectional structures of an electrostatic discharge (ESD) protection circuit according to an embodiment of the present invention.

FIG. 3. is schematic configurations showing circuit block diagrams and cross-sectional structures of an electrostatic discharge (ESD) protection circuit according to an embodiment of the present invention. Referring to FIGS. 1 and 3, the ESD protection circuit 340 in FIG. 3 corresponds to the ESD protection circuit 140 in FIG. 1. In order to illustrate the operating principle of this embodiment, an equivalent PMOS transistor diagram is added in the left configurations of FIG. 3, and an equivalent NMOS diagram is added in the right configurations of FIG. 3. These circuits in the left and the right configurations of FIG. 3 operate in the same way. In the following, only the ESD protection circuit 340 with the P-type SCR (PSCR) in the left configurations is discussed. The operating theory of the ESD protection circuit 340 with the N-type SCR (NSCR) in the right configurations is similar to that of the PSCR.

In the top left configuration of FIG. 3, the circuit is formed on a substrate, such as a P-type substrate. An well is formed within the substrate, such as an N-type well. As shown, doped regions are respectively formed within the substrate and the well to form the electrostatic discharge protection circuit 340 of the present invention. A first and a second first-type doped regions are located within the substrate and outside the well, in which the second first-type doped region is couple to the second power source Vdd2. A first and a second second-type doped regions are respectively close to the first and the second first-type doped regions, and located within the substrate and the well. A third and a fourth second-type doped regions are respectively close to the first and the second second-type doped regions and located within the well, in which the third second-type doped region is coupled to the second power source Vdd2. A first gate structure G1 is located above the substrate and between the first and the third second-type doped regions, where the first first-type doped region and the first gate structure G1 are coupled to the first power source Vdd1. A third first-type doped region, located within the well and between the third and the fourth second-type doped regions. A second gate structure G2 is located above the substrate and between the second and the fourth second-type doped regions, where the third first-type doped region, the fourth second-type doped region and the second gate structure G2 are coupled to the first power source Vdd1. In the above structure, the third second-type doped region and the third first-type doped region form a parasitic diode. The first first-type doped region, the substrate, the well and the third second-type doped region form a first semiconductor silicon controlled rectifier. The fourth second-type doped region, the well, the substrate and the second first-type doped region form a second semiconductor silicon controlled rectifier.

The ESD protection circuit 340 comprises two PSCRs 341a and 343a. The cathode of the PSCR 341a is coupled to the first power source Vdd1, and the anode of the PSCR 341a is coupled to the second power source Vdd2. The control gate of the PMOS transistor of the PSCR 341a is coupled to the first power source Vdd1. The anode of the PSCR 343a is coupled to the first power source Vdd1, and the cathode of the PSCR 343a is coupled to the second power source Vdd2. The control gate of the PMOS transistor of the PSCR 343a is also coupled to the first power source Vdd1. Accordingly, the turn-on or turn-off state of these PSCRs 341a and 343a is determined by the first power source Vdd1. If the first power source Vdd1 has an electrostatic voltage noise whose voltage is higher than the breakdown voltage of these PMOS transistors of these PSCRs, at this moment, the current generated after the breakdown of the PMOS transistor turns on the PSCR 343a. As a result, the current generated by the electrostatic voltage noise flows to the second power source Vdd2 through the ESD protection circuit 340. In this embodiment, the threshold voltages of the PSCR and the NSCR are, for example, about 1V.

If the second power source Vdd2 has a great electrostatic voltage noise, at this moment, the parasitic diode 344a between these PSCRs 341a and 343a is turned on because the second power source Vdd2 is far higher than the first power source Vdd1. As a result, the P+ region coupled to the second power source Vdd2 of the SCR 341a, the N-well region of the PSCR 341a, and the P-type substrate constitute a PNP bipolar junction transistor (BJT). The current is conducted to the P-type substrate, and therefore the PSCR 341a is turned on. In addition, if a voltage difference of the second power source Vdd2 relative to the first power source Vdd1 is larger than the threshold voltage of the PMOS transistor of the PSCR 341a, the PSCR 341a will be turned on. The current generated by the electrostatic voltage noise flows to the first power source Vdd1 through the ESD protection circuit 340 in order to achieve the object of the present invention.

FIG. 3 also shows another embodiment of the present invention. Since the circuit structure shown in right part of FIG. 3 is constructed by NSCR, having a similar structure like the left part, the detail description on its structure is omitted. In the bottom left configuration of FIG. 3, since the control gates of these PMOS transistors of the PSCRs 341a and 343a are coupled to the first power source Vdd1, two N-well regions can be a same N-well region. Accordingly, the layout area of the circuit is substantially reduced. The dotted-line diode represents the location of the parasitic diode 34a. Therefore, since the control gates of these NMOS transistors of the NSCRs 341b and 343b are coupled to the second power source Vss2, two N-well regions can be a same N-well region. The dotted-line diode represents the location of the parasitic diode 344b.

Figure 4:
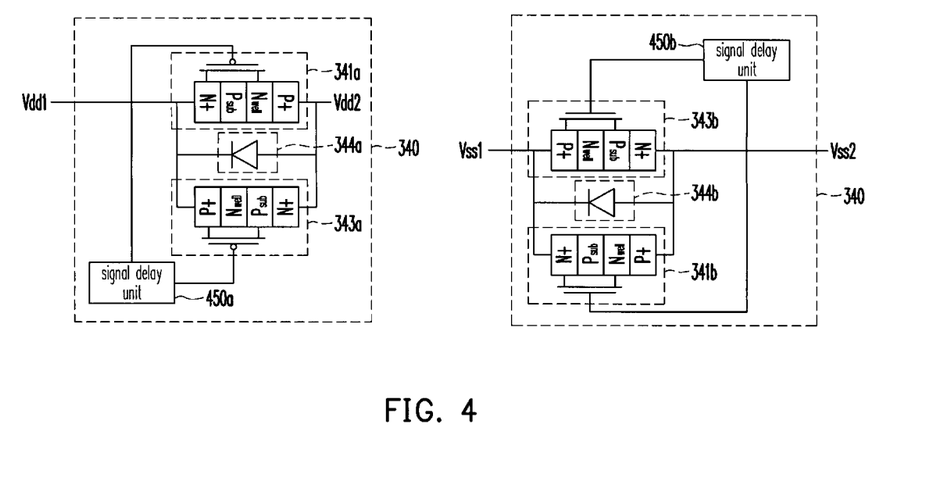
FIG. 4. is schematic configurations showing circuit block diagrams of an electrostatic discharge (ESD) protection circuit according to another embodiment of the present invention.

FIG. 4. is schematic configurations showing circuit block diagrams of an electrostatic discharge (ESD) protection circuit according to another embodiment of the present invention. The block circuits in FIG. 4 are similar to those in FIG. 3. The only different is a signal delay unit (for example, a soft-pull-up circuit unit) 450a coupled between the control gate of the PSCR 343a and the first power source Vdd1 in FIG. 4.

The signal delay units 450a and 450b are similar devices, transceiving and delaying the electrostatic voltage noises occurring between the first power source Vdd1 and the second power source Vdd2. These electrostatic voltage noises are delayed for from about hundreds of nanoseconds to about microseconds. When these electrostatic voltage noises are generated, the control gate of the PMOS transistor of the PSCR 343a can be kept in the low-voltage state in order to maintain a turn-on state of the first power source Vdd1 and the second power source Vdd2. By the same theory, the control gate of the NMOS transistor of the NSCR 343b are kept in the high-voltage state when these electrostatic voltage noises occur. Detailed descriptions are not repeated.

Usually an electrostatic voltage noise occurs for only about hundreds of nanoseconds. The signal delay units 450a and 450b, while the electrostatic voltage noise occurs, electrically connect the first power source Vdd1 and the second power source Vdd2 for a period of time so that the electrostatic voltage noise can be transmitted therebetween. Accordingly, the ESD protection circuit can immediately remove the electrostatic voltage noise.

Figure 5:
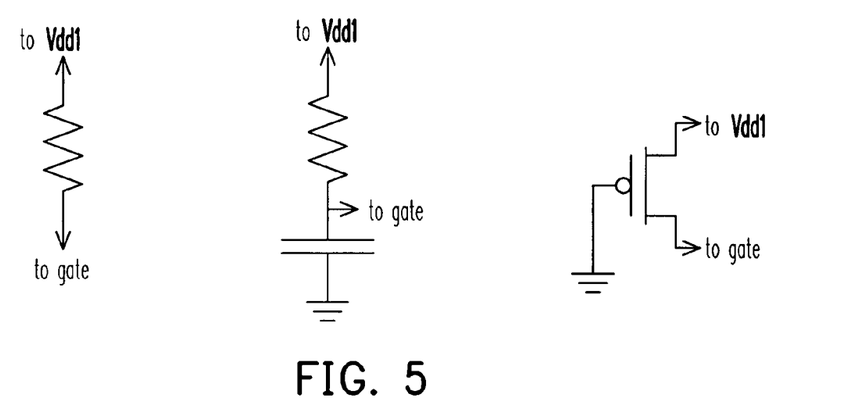
FIG. 5 is schematic drawings showing the soft-pull-up unit circuit 450a according to another embodiment of the present invention.
Figure 6:
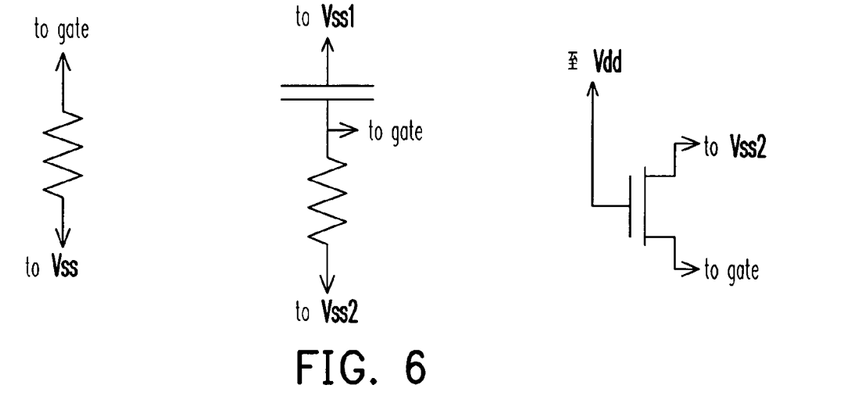
FIG. 6 is schematic drawings showing the soft-pull-up unit circuit 450b according to another embodiment of the present invention.

FIG. 5 is schematic drawings showing the soft-pull-up unit circuit 450a according to another embodiment of the present invention. FIG. 6 is schematic drawings showing the soft-pull-up unit circuit 450b according to another embodiment of the present invention. Referring to FIGS. 5 and 6, the delay time is so short that the circuit (a) comprising just one resistor is sufficient to delay the noise. The circuit (b) uses a resistor-capacitor (RC) circuit to modify the delay time based on the capacitance. The circuit (c) uses a transmission gate as the signal delay unit. With the resistor and the parasitic capacitor in the transmission gate, the electrostatic voltage noise can be delayed. Accordingly, the object for transceiving and delaying electrostatic voltage noises can be achieved.

Figure 7:
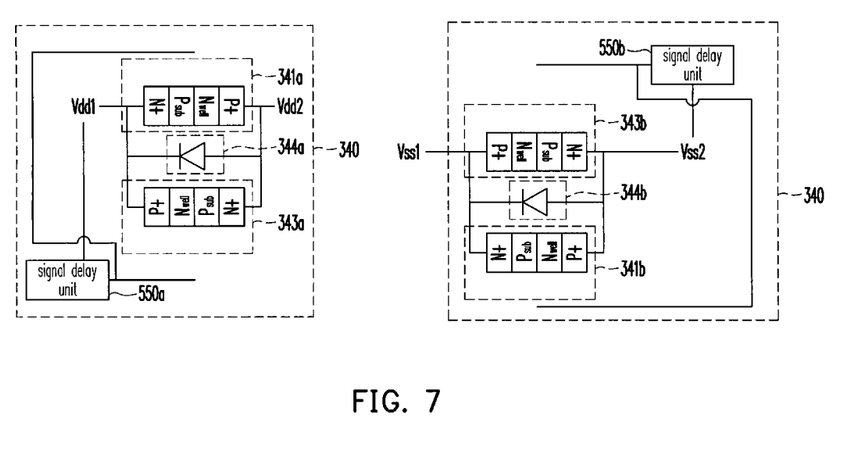
FIG. 7 is schematic configurations showing circuit block diagrams of an electrostatic discharge (ESD) protection circuit according to yet another embodiment of the present invention.

FIG. 7 is schematic configurations showing circuit block diagrams of an electrostatic discharge (ESD) protection circuit according to yet another embodiment of the present invention. The circuit block diagrams in FIG. 7 are similar to those in FIG. 3. The only different is a signal delay unit 550a coupled between the control gate of the PSCR 343a and the first power source Vdd1, and between the control gate of the PSCR 341a and the first power source Vdd1 in FIG. 7. Both control gates of these PSCRs 341a and 343a are triggered by the first power source Vdd1. In this embodiment, when a positive electrostatic voltage noise occurs at the first power source Vdd1, the electrostatic voltage noise transmitted to the control gates of the PSCRs 341a and 343a is delayed by the signal delay unit and the control gates will be kept at low voltages for a period of time. Therefore, the PSCRs 341a and 343a are turned on to continuously turn on the first power source Vdd1 and the second power source Vdd2. The signal delay unit 550a in FIG. 7 and the signal delay unit 450a in FIG. 4 are the same.

The right configuration is similar to the left configuration in FIG. 7. The only difference is the signal delay unit 550b coupled between the control gate of the NSCR 343b and the second power source Vss2, and between the control gate of the NSCR 341b and the second power source Vss2. The signal delay unit 550b in FIG. 7 and the signal delay unit 450b in FIG. 4 are the same.

According to the voltage difference between the first power source Vdd1 and the second power source Vdd2, multiple PSCRs (not shown) connected in series can be disposed between the first power source Vdd1 and the second power source Vdd2 in the ESD protection circuit. The detailed theory is not repeated. According to the voltage difference between the power source Vss1 and the power source Vss2, multiple NSCRs (not shown) connected in series are disposed between the power sources Vss1 and Vss2 in the ESD protection circuit.

From the descriptions above, the control gates of the metal-oxide-semiconductor transistors of these silicon controlled rectifiers are coupled to the same power source. As a result, the turn-on or turn-off state of these two silicon controlled rectifiers is controlled by the same power source. Accordingly, without connecting multiple silicon controlled rectifiers in series, the voltage difference between the first power source and the second power source can be increased. Moreover, since coupled to the same power source, the control gates of the metal-oxide-semiconductor transistors can be formed in the same N-well region. Therefore, the layout area of the circuit can be decreased and the manufacturing costs reduced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An electrostatic discharge protection circuit adapted for an integrated circuit with a first power source and a second power source, the protection circuit comprising:
    a first silicon controlled rectifier, comprising a first metal-oxide-semiconductor transistor, wherein a cathode of the first silicon controlled rectifier is coupled to the first power source, and an anode of the first silicon controlled rectifier is coupled to the second power source;
    a second silicon controlled rectifier, comprising a second metal-oxide-semiconductor transistor, wherein an anode of the second silicon controlled rectifier is coupled to the first power source, a cathode of the second silicon controlled rectifier is coupled to the second power source, and gates of the first and the second metal-oxide-semiconductor transistors are coupled to the first power source or the second power source; and
    a parasitic diode, wherein a cathode of the parasitic diode is coupled to the first power source, and an anode of the parasitic diode is coupled to the second power source.

2. The electrostatic discharge protection circuit of claim 1, wherein the first and the second power sources are high power sources in a system, the first and the second metal-oxide-semiconductor transistors are P-type transistors, and the gates thereof are coupled to the first power source.

3. The electrostatic discharge protection circuit of claim 2, further comprising a signal delay unit coupled between the first power source and the gate of the P-typed second metal-oxide-semiconductor transistor.

4. The electrostatic discharge protection circuit of claim 3, wherein the signal delay unit is composed of a resistor.

5. The electrostatic discharge protection circuit of claim 3, wherein the signal delay unit is composed of a resistor and a capacitor.

6. The electrostatic discharge protection circuit of claim 3, wherein the signal delay circuit unit is a transmission gate.

7. The electrostatic discharge protection circuit of claim 1, wherein the first and the second power sources are low power sources in a system, the first and the second metal-oxide-semiconductor transistors are N-type transistors, and the gates thereof are coupled to the second power source.

8. The electrostatic discharge protection circuit of claim 7, further comprising a signal delay unit coupled between the second power source and the gate of the N-type first metal-oxide-semiconductor transistor.

9. The electrostatic discharge protection circuit of claim 8, wherein the signal delay unit is composed of a resistor.

10. The electrostatic discharge protection circuit of claim 8, wherein the signal delay unit is composed of a resistor and a capacitor.

11. The electrostatic discharge protection circuit of claim 8, wherein the signal delay unit is a transmission gate.

12. An electrostatic discharge protection circuit adapted for an integrated circuit with a first power source and a second power source, the protection circuit comprising:
    a first silicon controlled rectifier, comprising a first metal-oxide-semiconductor transistor, wherein a cathode of the first silicon controlled rectifier is coupled to the first power source, and an anode of the first silicon controlled rectifier is coupled to the second power source;
    a second silicon controlled rectifier, comprising a second metal-oxide-semiconductor transistor, wherein an anode of the second silicon controlled rectifier is coupled to the first power source, a cathode of the second silicon controlled rectifier is coupled to the second power source, and gates of the first and the second metal-oxide-semiconductor transistors are coupled to the first power source or the second power source through a signal delay unit; and
    a parasitic diode, wherein a cathode of the parasitic diode is coupled to the first power source, and an anode of the parasitic diode is coupled to the second power source.

13. The electrostatic discharge protection circuit of claim 12, wherein the first and the second power sources are high power sources in a system, the first and the second metal-oxide-semiconductor transistors are P-type transistors, and the gates thereof are coupled to the first power source through the signal delay unit.

14. The electrostatic discharge protection circuit of claim 12, wherein the first and the second power sources are low power sources in a system, the first and the second metal-oxide-semiconductor transistors are N-type transistors, and the gates thereof are coupled to the second power source through the signal delay unit.

15. The electrostatic discharge protection circuit of claim 12, wherein the signal delay unit is a circuit composed of a resistor.

16. The electrostatic discharge protection circuit of claim 12, wherein the signal delay unit is a circuit composed of a resistor and a capacitor.

17. The electrostatic discharge protection circuit of claim 12, wherein the signal delay unit is a transmission gate.

18. A semiconductor circuit with an electrostatic discharge protection circuit, comprising:
    a first integrated circuit electrically coupled to a first high power source and a first low power source;
    a second integrate circuit electrically coupled to a second high power source and a second low power source;
    a first electrostatic discharge protection circuit coupled between the first and the second high power sources, the protection circuit further comprising:
        a first P-type silicon controlled rectifier comprising a first P-type metal-oxide-semiconductor transistor, wherein a cathode of the first P-type silicon controlled rectifier is coupled to the first high power source, and an anode of the first P-type silicon controlled rectifier is coupled to the second high power source;

a second P-type silicon controlled rectifier comprising a second P-type metal-oxide-semiconductor transistor, wherein an anode of the second P-type silicon controlled rectifier is coupled to the first high power source, a cathode of the second P-type silicon controlled rectifier is coupled to the second high power source, and gates of the first and the second P-type metal-oxide-semiconductor transistors are coupled to the first high power source; and a first parasitic diode, wherein a cathode of the first parasitic diode is coupled to the first high power source, and an anode of the first parasitic diode is coupled to the second high power source; and a second electrostatic discharge protection circuit coupled between the first and the second low power sources, the protection circuit further comprising:

a first N-type silicon controlled rectifier comprising a first N-type metal-oxide-semiconductor transistor, wherein a cathode of the first N-type silicon controlled rectifier is coupled to the first low power source, and an anode of the first N-type silicon controlled rectifier is coupled to the second low power source;

a second N-type silicon controlled rectifier comprising a second n-type metal-oxide-semiconductor transistor, wherein an anode of the second n-type silicon controlled rectifier is coupled to the first low power source, a cathode of the second N-type silicon controlled rectifier is coupled to the second low power source, and gates of the first and the second N-type metal-oxide-semiconductor transistors are coupled to the second low power source; and a second parasitic diode, wherein a cathode of the second parasitic diode is coupled to the first low power source, and an anode of the second parasitic diode is coupled to the second low power source.

19. The semiconductor circuit with an electrostatic discharge protection circuit of claim 18, further comprising a first signal delay unit electrically coupled between the first high power source and the gate of the second P-type metal-oxide-semiconductor transistor.

20. The semiconductor circuit with an electrostatic discharge protection circuit of claim 19, wherein the first and the second signal delay units are circuits composed of resistors.

21. The semiconductor circuit with an electrostatic discharge protection circuit of claim 19, wherein the first and the second signal delay units circuits composed of resistors and capacitors.

22. The semiconductor circuit with an electrostatic discharge protection circuit of claim 19, wherein the first and the second signal delay units are transmission gates.

23. The semiconductor circuit with an electrostatic discharge protection circuit of claim 18, further comprising a second signal delay unit electrically coupled between the second low power source and the gate of the first N-type metal-oxide-semiconductor transistor.

24. The semiconductor circuit with an electrostatic discharge protection circuit of claim 23, wherein the first and the second signal delay units are circuits composed of resistors.

25. The semiconductor circuit with an electrostatic discharge protection circuit of claim 23, wherein the first and the second signal delay signal delay units circuits composed of resistors and capacitors.

26. The semiconductor circuit with an electrostatic discharge protection circuit of claim 23, wherein the first and the second signal delay units are transmission gates.

27. The semiconductor circuit with an electrostatic discharge protection circuit of claim 18, the semiconductor circuit further comprising:

a first electrostatic discharge clamping circuit electrically coupled between the first high power source and the first low power source; and a second electrostatic discharge clamping circuit electrically coupled between the second high power source and the second low power source.

28. The semiconductor circuit with an electrostatic discharge protection circuit of claim 18, the semiconductor circuit further comprising an interface circuit electrically coupled between the first integrated circuit and the second integrated circuit, and between the first and second high power sources and the first and second low power sources.

29. A semiconductor circuit with an electrostatic discharge protection circuit, the semiconductor circuit comprising:

a first integrated circuit electrically coupled to a first high power source and a first low power source;

a second integrate circuit electrically couple to a second high power source and a second low power source;

a first electrostatic discharge protection circuit coupled between the first and the second high power sources, the protection circuit further comprising:

a first P-type silicon controlled rectifier comprising a first P-type metal-oxide-semiconductor transistor, wherein a cathode of the first P-type silicon controlled rectifier is coupled to the first high power source, and an anode of the first P-type silicon controlled rectifier is coupled to the second high power source;

a second P-type silicon controlled rectifier comprising a second P-type metal-oxide-semiconductor transistor, wherein an anode of the second P-type silicon controlled rectifier is coupled to the first high power source, a cathode of the second P-type silicon controlled rectifier is coupled to the second high power source, and gates of the first and the second P-type metal-oxide-semiconductor transistors are coupled to the first high power source through a first signal delay unit; and a first parasitic diode, wherein a cathode of the first parasitic diode is coupled to the first high power source, and an anode of the first parasitic diode is coupled to the second high power source; and a second electrostatic discharge protection circuit coupled between the first and the second low power sources, the protection circuit comprising:

a first N-type silicon controlled rectifier comprising a first N-type metal-oxide-semiconductor transistor, wherein a cathode of the first N-type silicon controlled rectifier is coupled to the first low power source, and an anode of the first N-type silicon controlled rectifier is coupled to the second low power source;

a second N-type silicon controlled rectifier comprising a second n-type metal-oxide-semiconductor transistor, wherein an anode of the second n-type silicon controlled rectifier is coupled to the first low power source, a cathode of the second N-type silicon controlled rectifier is coupled to the second low power source, and gates of the first and the second N-type metal-oxide-semiconductor transistors are coupled to the second low power source through a second signal delay unit; and a second parasitic diode, wherein a cathode of the second parasitic diode is coupled to the first low power source, and an anode of the second parasitic diode is coupled to the second low power source.

30. The semiconductor circuit with an electrostatic discharge protection circuit of claim 29, wherein the first and the second signal delay units are circuits composed of resistors.

31. The semiconductor circuit with an electrostatic discharge protection circuit of claim 29, wherein the first and the second signal delay units are circuits composed of resistors and capacitors.

32. The semiconductor circuit with an electrostatic discharge protection circuit of claim 29, wherein the first and the second signal delay units are transmission gates.

33. The semiconductor circuit with an electrostatic discharge protection circuit of claim 29, the semiconductor circuit further comprising:

a first electrostatic discharge clamping circuit electrically coupled between the first high power source and the first low power source; and a second electrostatic discharge clamping circuit electrically coupled between the second high power source and the second low power source.

34. The semiconductor circuit with an electrostatic discharge protection circuit of claim 29, the semiconductor circuit further comprising an interface circuit electrically coupled between the first integrated circuit and the second integrated circuit, and between the first and second high power sources and the first and second low power sources.

35. A semiconductor circuit for electrostatic discharge protection, adapted for an integrated circuit with a first power source and a second power source, the protection circuit comprising:

a substrate;

a well located within the substrate;

a first and a second first-type doped regions, located within the substrate and outside the well, wherein the second first-type doped region is couple to the second power source;

a first and a second second-type doped regions, respectively close to the first and the second first-type doped regions, and located within the substrate and the well;

a third and a fourth second-type doped regions, respectively close to the first and the second second-type doped regions and located within the well, wherein the third second-type doped region is coupled to the second power source;

a first gate structure, located above the substrate and between the first and the third second-type doped regions, wherein the first first-type doped region and the first gate structure are coupled to the first power source;

a third first-type doped region, located within the well and between the third and the fourth second-type doped regions; and a second gate structure, located above the substrate and between the second and the fourth second-type doped regions, wherein the third first-type doped region, the fourth second-type doped region and the second gate structure are coupled to the first power source, wherein the third second-type doped region and the third first-type doped region form a parasitic diode; the first first-type doped region, the substrate, the well and the third second-type doped region form a first semiconductor silicon controlled rectifier; and the fourth second-type doped region, the well, the substrate and the second first-type doped region form a second semiconductor silicon controlled rectifier.

36. The semiconductor circuit of claim 35, wherein the first-type doped region is an N-type doped region, and the second-type doped region is a P-type doped region.

37. The semiconductor circuit of claim 35, wherein the substrate is a P-type substrate and the well is a N-type well.

38. The semiconductor circuit of claim 35, wherein the first and the second power source are relatively high power sources but not equal in the semiconductor circuit.

39. A semiconductor circuit for electrostatic discharge protection, adapted for an integrated circuit with a first power source and a second power source, the protection circuit comprising:

a substrate;

a well located within the substrate;

a first and a second first-type doped regions, located within the substrate and outside the well, wherein the first first-type doped region is couple to the first power source, and the second first-type doped region is couple to the second power source;

a third and a fourth first-type doped regions, respectively close to the first and the second first-type doped regions, and located within the substrate and the well;

a first gate structure, located above the substrate and between the first and the third first-type doped regions, wherein the first gate structure are coupled to the second power source;

a second gate structure, located above the substrate and between the second and the fourth first-type doped regions, wherein the second gate structure are coupled to the second power source;

a first and a second second-type doped regions, respectively close to the third and the fourth first-type doped regions and located within the well, wherein the first second-type doped region is coupled to the second power source and wherein the second second-type doped region is coupled to the first power source;

a fifth first-type doped region, located within the well and between the first and the second second-type doped regions, wherein the said fifth first-type doped region is coupled to the first voltage source, wherein the first second-type doped region and the fifth first-type doped region form a parasitic diode; the first first-type doped region, the substrate, the well and the first second-type doped region form a first semiconductor silicon controlled rectifier; and the second second-type doped region, the well, the substrate and the second first-type doped region form a second semiconductor silicon controlled rectifier.

40. The semiconductor circuit of claim 39, wherein the first-type doped region is an N-type doped region, and the second-type doped region is a P-type doped region.

41. The semiconductor circuit of claim 39, wherein the substrate is a P-type substrate and the well is a N-type well.

42. The semiconductor circuit of claim 39, wherein the first and the second power source are relatively low power sources but not equal in the semiconductor circuit.

* * * * *